United States Patent
Lee et al.

(10) Patent No.: US 10,847,410 B2
(45) Date of Patent: Nov. 24, 2020

(54) RUTHENIUM-CONTAINING SEMICONDUCTOR STRUCTURE AND METHOD OF MANUFACTURING THE SAME

(71) Applicant: TAIWAN SEMICONDUCTOR MANUFACTURING CO., LTD., Hsinchu (TW)

(72) Inventors: Shen-Nan Lee, Hsinchu County (TW); Teng-Chun Tsai, Hsinchu (TW); Chen-Hao Wu, Keelung (TW); Chu-An Lee, Hsinchu (TW); Chun-Hung Liao, Taichung (TW); Tsung-Ling Tsai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/129,899

(22) Filed: Sep. 13, 2018

(65) Prior Publication Data
US 2020/0090983 A1    Mar. 19, 2020

(51) Int. Cl.
*H01L 21/768* (2006.01)
*H01L 23/532* (2006.01)
*H01L 23/522* (2006.01)

(52) U.S. Cl.
CPC .... *H01L 21/76802* (2013.01); *H01L 21/7684* (2013.01); *H01L 21/76831* (2013.01); *H01L 21/76879* (2013.01); *H01L 23/5226* (2013.01); *H01L 23/53209* (2013.01)

(58) Field of Classification Search
CPC ......... H01L 21/76802; H01L 21/26831; H01L 21/7684; H01L 21/76879; H01L 23/5226; H01L 23/53209
See application file for complete search history.

(56) References Cited

U.S. PATENT DOCUMENTS

| | | | | |
|---|---|---|---|---|
| 5,169,680 | A * | 12/1992 | Ting | H01L 21/288 257/E21.174 |
| 7,416,982 | B2 * | 8/2008 | Lee | H01L 21/76846 257/E21.585 |
| 8,518,793 | B2 * | 8/2013 | Kim | C23C 16/40 438/396 |
| 8,609,531 | B1 * | 12/2013 | Zhang | H01L 23/53238 257/E21.582 |

(Continued)

*Primary Examiner* — Allen L Parker
*Assistant Examiner* — Gustavo G Ramallo
(74) *Attorney, Agent, or Firm* — McClure, Qualey & Rodack, LLP

(57) ABSTRACT

A method of manufacturing a semiconductor structure includes: forming a dielectric layer over a conductive layer; removing a portion of the dielectric layer to form an opening exposing a portion of the conductive layer; filling a ruthenium-containing material in the opening and in contact with the dielectric layer; and polishing the ruthenium-containing material using a slurry including an abrasive and an oxidizer selected from the group consisting of hydrogen peroxide ($H_2O_2$), potassium periodate ($KIO_4$), potassium iodate ($KIO_3$), potassium permanganate ($KMnO_4$), iron(III) nitrate ($FeNO_3$) and a combination thereof.

20 Claims, 2 Drawing Sheets

(56) References Cited

U.S. PATENT DOCUMENTS

| | | | |
|---|---|---|---|
| 2002/0047201 A1* | 4/2002 | Suzuki | H01L 21/76802 257/751 |
| 2003/0166338 A1* | 9/2003 | Ahn | C09G 1/02 438/689 |
| 2003/0168627 A1* | 9/2003 | Singh | C09G 1/02 252/79.1 |
| 2007/0082132 A1* | 4/2007 | Shinriki | C23C 16/36 427/255.394 |
| 2007/0273044 A1* | 11/2007 | Yang | H01L 21/76825 257/775 |
| 2007/0293049 A1* | 12/2007 | Minamihaba | C09G 1/02 438/692 |
| 2017/0170063 A1* | 6/2017 | Edelstein | H01L 21/76883 |
| 2018/0273802 A1* | 9/2018 | Granstrom | C09G 1/02 |
| 2019/0164817 A1* | 5/2019 | Khaderbad | H01L 29/66545 |
| 2019/0300750 A1* | 10/2019 | Lin | C23F 1/44 |
| 2019/0352537 A1* | 11/2019 | Ono | B24B 37/00 |

* cited by examiner

RUTHENIUM-CONTAINING SEMICONDUCTOR STRUCTURE AND METHOD OF MANUFACTURING THE SAME

BACKGROUND

Continuing advances in semiconductor manufacturing processes have resulted in semiconductor devices with finer features and/or higher degrees of integration. Among the various features included within a semiconductor device, contact structures typically provide an electrical connection between circuit devices and/or interconnection layers. A typical contact structure may include forming a contact hole in a dielectric and then filling the contact hole with a conductive material. Generally, a diffusion barrier is formed in the contact hole before filling the contact hole with the conductive material. However, the diffusion barrier leads to high resistance of the contact hole, which is not conducive to the device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
FIGS. 1 to 4 are cross-sectional views at various stages of manufacturing a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As mentioned above, the diffusion barrier formed in the contact hole before filling the contact hole with the conductive material is not conducive to the device performance. It is also found that if there is no diffusion barrier disposed between the dielectric and conductive material, the dielectric and the conductive material may be separated during polishing the conductive material, which forms a peeling interface between the dielectric and the conductive material. The polishing slurry may enter the peeling interface and corrode the structure underlying the dielectric and the conductive material. Therefore, the present disclosure provides a method of manufacturing a semiconductor structure to solve the issues above. Embodiments of the method of manufacturing the semiconductor structure will be described below in detail.

FIGS. 1 to 4 are cross-sectional views at various stages of manufacturing a semiconductor structure in accordance with some embodiments of the present disclosure.

As shown in FIG. 1, a dielectric layer 120 is formed over a conductive layer 110. In some embodiments, the conductive layer 110 includes metal or alloy. In some embodiments, the conductive layer 110 includes a metal selected from the group consisting of tungsten (W), cobalt (Co), ruthenium (Ru), other suitable metals and a combination thereof. In some embodiments, the conductive layer 110 is formed using sputtering, atomic layer deposition (ALD), physical vapor deposition (PVD), chemical vapor deposition (CVD), e-beam evaporation, other methods known and used in the art for forming the conductive layer 110 or a combination thereof.

In some embodiments, the dielectric layer 120 includes an inter-layer dielectric (ILD) layer. In some embodiments, the dielectric layer 120 includes a dielectric material such as silicon oxide, silicon oxynitride, tetraethylorthosilicate (TEOS) oxide, un-doped silicate glass (USG), or doped silicon oxide such as borophosphosilicate glass (BPSG), fused silica glass (FSG), phosphosilicate glass (PSG), boron doped silicon glass (BSG), and/or other suitable dielectric materials. In some embodiments, such dielectric layer 120 is formed using sputtering, PVD, CVD, metal organic CVD (MOCVD), molecular beam epitaxy (MBE), other methods known and used in the art for forming the dielectric layer 120 or a combination thereof.

In some embodiments, the dielectric layer 120 includes a contact etch stop layer (CESL). In some embodiments, the dielectric layer 120 includes silicon nitride, silicon oxide, silicon oxynitride, and/or other materials known in the art. In some embodiments, such dielectric layer 120 is formed using sputtering, PVD, CVD, MOCVD, MBE, and/or other suitable deposition or oxidation processes.

Figure 2:
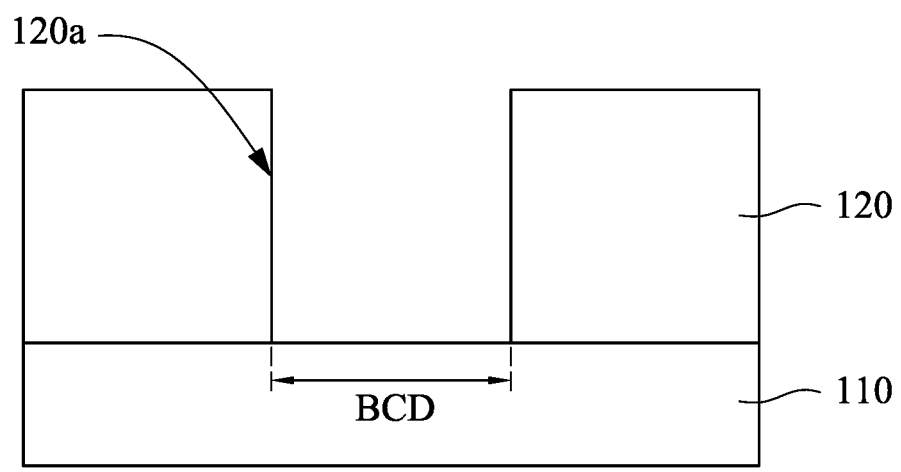

As shown in FIG. 2, a portion of the dielectric layer 120 is removed to form an opening 120a exposing a portion of the conductive layer 110. In some embodiments, a patterning process is performed on the dielectric layer 120 to form the opening 120a. In some embodiments, the patterning process includes photolithographic (including exposure and development) and etching processes. In some embodiments, the opening 120a has a bottom critical dimension BCD in a range of from 1 nm to 20 nm. In some embodiments, the opening 120a has a bottom critical dimension BCD in a range of from 5 nm to 15 nm. In some embodiments, the opening 120a has a bottom critical dimension BCD in a range of from 8 nm to 10 nm.

However, all dimensions disclosed herein are by way of example only and not be way of limitation. It is contemplated that other structures and methods employing layers and features of these dimensions as well as other dimensions will be apparent to those skilled in the art once informed by the present disclosure—and such other structures, methods, and dimensions are within the contemplated scope of the present disclosure.

Figure 3:
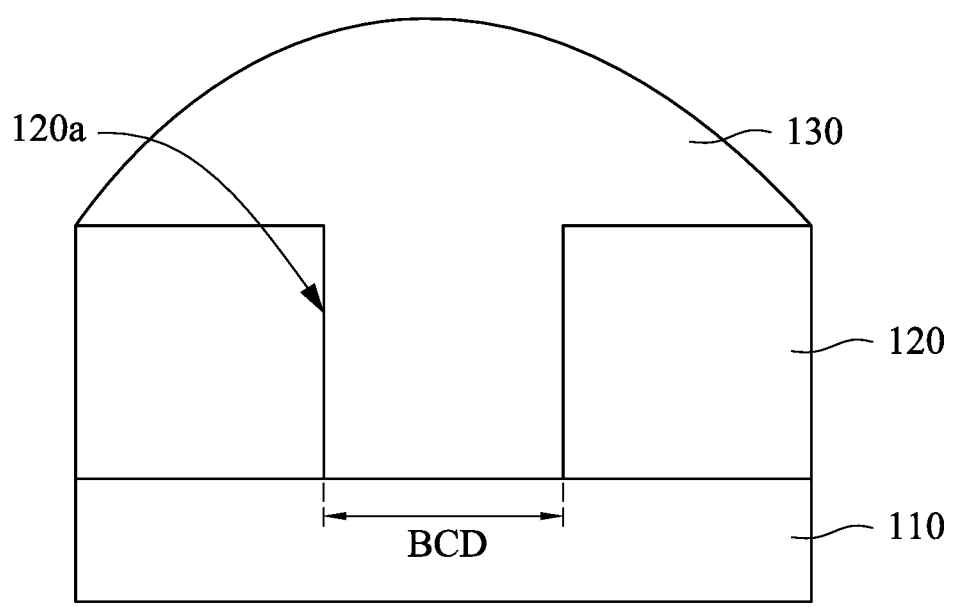

As shown in FIG. 3, a ruthenium-containing material 130 is filled in the opening 120a and in contact with the dielectric layer 120. In some embodiments, the ruthenium-containing material 130 only includes ruthenium. In some embodiments, the ruthenium-containing material 130 is formed using sputtering, ALD, PVD, CVD, e-beam evaporation, other methods known and used in the art for forming the ruthenium-containing material 130 or a combination thereof.

Figure 4:
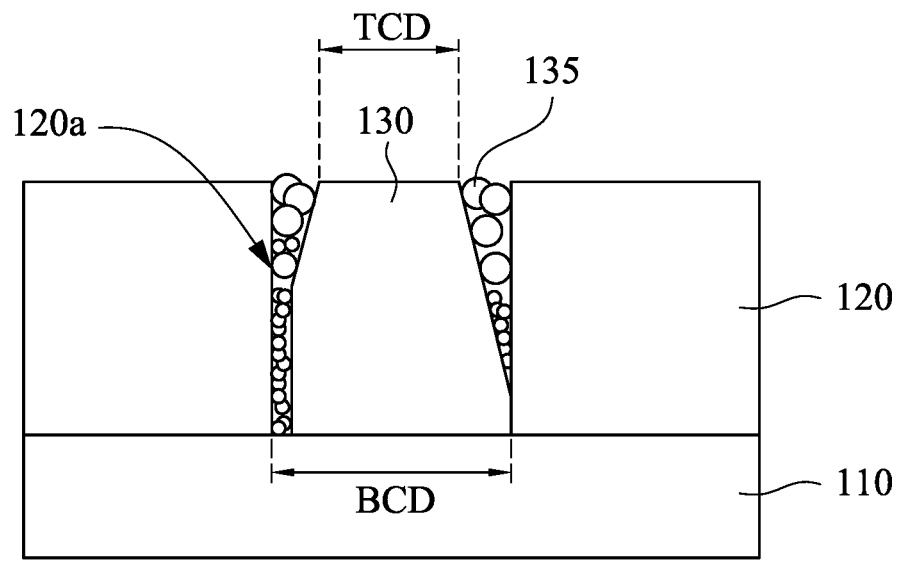

As shown in FIG. 4, the ruthenium-containing material 130 is chemically mechanically polished using a slurry including an abrasive and an oxidizer.

In some embodiments, the abrasive is selected from the group consisting of silicon oxide (e.g., $SiO_2$), titanium oxide (e.g., $TiO_2$), aluminum oxide (e.g., $Al_2O_3$), zirconium oxide (e.g., $ZrO_2$), cerium oxide (e.g., $CeO_2$) and a combination thereof. In some embodiments, the abrasive is in a range of from 0.1 wt % to 1 wt % based on the total weight of the slurry. In some embodiments, the abrasive is in a range of from 0.2 wt % to 0.8 wt % based on the total weight of the slurry. In some embodiments, the abrasive has a diameter in a range of from 10 nm to 90 nm. In some embodiments, the diameter of the abrasive is in a range of from 25 nm to 50 nm. In some embodiments, the abrasive has two diameters respectively in a range of from 10 nm to 50 nm and a range of from 50 nm to 90 nm, and a difference between the two diameters is in a range of from 15 nm to 80 nm. In some embodiments, the difference between the two diameters of the abrasive is in a range of from 20 nm to 40 nm. The abrasive having two diameters (also called as "bi-model") can enhance removal of residues (e.g., ruthenium residues) during performing the chemical mechanical polishing (CMP) process. In some embodiments, the abrasive described above will not cause peeling between the dielectric layer 120 and the ruthenium-containing material 130.

In some embodiments, the oxidizer is configured to oxidize the ruthenium-containing material 130 to form by-products 135 in the opening 120a and laterally between the dielectric layer 120 and the ruthenium-containing material 130, as shown in FIG. 4. That is, the by-products 135 can fill the interspace between the dielectric layer 120 and the ruthenium-containing material 130 formed during the CMP process, such that the slurry fails to penetrate through the interspace to be in contact with the conductive layer 110 underlying the dielectric layer 120 and the ruthenium-containing material 130. In some embodiments, the oxidizer is configured to oxidize ruthenium of the ruthenium-containing material 130 to form ruthenium oxide 135 in the opening 120a and laterally between the dielectric layer 120 and the ruthenium-containing material 130. In some embodiments, the ruthenium oxide material 135 includes ruthenium dioxide ($RuO_2$), ruthenium tetroxide ($RuO_4$), or a combination thereof. In some embodiments, the oxidizer is selected from the group consisting of hydrogen peroxide ($H_2O_2$), potassium periodate ($KIO_4$), potassium iodate ($KIO_3$), potassium permanganate ($KMnO_4$), iron(III) nitrate ($FeNO_3$), other suitable oxidizers and a combination thereof. In some embodiments, the oxidizer is in a range of from 0.1 wt % to 2 wt % based on the total weight of the slurry. In some embodiments, the oxidizer is in a range of from 0.1 wt % to 0.5 wt % based on the total weight of the slurry. In some embodiments, the oxidizer described above has a very low static etch rate (SER) and will not cause corrosion of the conductive layer 110.

In some embodiments, the slurry further includes a corrosion inhibitor. The corrosion inhibitor is configured to inhibit corrosion of the conductive layer 110. In some embodiments, the corrosion inhibitor is selected from the group consisting of benzotriazole (BTA), hexamine, phenylenediamine, dimethylethanolamine, 2-mercapto-benzothiazole (MBT), benzimidazole (BIA), tolyltrizofe (TTA), 5-hexyl-1,2,3-benzotriazole (C6BTA), 3-amino-5-heptyl-1,2,4-triazole (AHT), 2-amino-thiazole (AZT), 2-amino-4,6-dimethyl-parimidine (ADMP), 3-phenyl-1,2,4-triazole (PTH), 3-phenyl-1,2,4-triazole-5-one, piperidine, phenyl-amino-triazine-dithiol (PTD), potassium ethylxanthate (KEX), benzylamine (BZA), ethanolamine, sodium tripolyphosphate, antioxidants and a combination thereof. In some embodiments, the corrosion inhibitor is in a range of from 0.001 wt % to 1 wt % based on the total weight of the slurry.

In some embodiments, the slurry further includes a polymer. The polymer is configured to reduce penetration of the slurry. In some embodiments, the polymer is selected from the group consisting of polyisocyante, polyamide, poly(methylmethacrylate), other suitable polymers and a combination thereof. In some embodiments, the polymer is in a range of from 0.01 wt % to 0.1 wt % based on the total weight of the slurry.

In some embodiments, the slurry further includes a surfactant. The surfactant is configured to change hydrophilic/hydrophobic property to prevent the slurry attacking the conductive layer 110. By the term 'surfactant' as used herein in meant any chemical additive including a cationic, anionic, or nonionic surfactant where the chemical structure includes at least one hydrophilic group and at least one hydrophobic group. In some embodiments, the surfactant is selected from the group consisting of nonionic-anionic surfactants, Gemini surfactants, sodium dodecylsulfate (SDS), benzyl trim ethyl ammonium chloride (BTEAC) and a combination thereof. In some embodiments, the surfactant is in a range of from 0.001 wt % to 0.5 wt % based on the total weight of the slurry.

In some embodiments, the method further includes performing an annealing process on the ruthenium-containing material 130 before polishing the ruthenium-containing material 130. In some embodiments, the annealing process is performed at a temperature in a range of from 100° C. to 600° C. In some embodiments, the annealing process is performed at a temperature in a range of from 150° C. to 500° C. In some embodiments, the annealing process is performed to increase grain size of the ruthenium-containing material.

In some embodiments, the method further includes performing a plasma cleaning process before filling the ruthenium-containing material 130 in the opening 120a and in contact with the dielectric layer 120. In some embodiments, a process gas of the plasma cleaning process comprises argon (Ar), hydrogen peroxide ($H_2O_2$), carbon dioxide ($CO_2$), other suitable gases or a combination thereof.

The present disclosure also provides another method of manufacturing a semiconductor structure. Embodiments of the method of manufacturing the semiconductor structure will be described below in detail.

As shown in FIG. 2, a dielectric layer 120 is formed over a conductive layer 110, and the dielectric layer 120 has an opening 120a exposing a portion of the conductive layer 120. In some embodiments, the conductive layer 110 includes metal or alloy. In some embodiments, the conductive layer 110 includes a metal selected from the group consisting of tungsten (W), cobalt (Co), ruthenium (Ru), other suitable metals and a combination thereof. In some embodiments, the conductive layer 110 is formed using sputtering, atomic layer deposition (ALD), physical vapor deposition (PVD), chemical vapor deposition (CVD), e-beam evaporation, other methods known and used in the art for forming the conductive layer 110 or a combination thereof.

In some embodiments, the dielectric layer 120 includes an inter-layer dielectric (ILD) layer. In some embodiments, the dielectric layer 120 includes a dielectric material such as silicon oxide, silicon oxynitride, tetraethylorthosilicate (TEOS) oxide, un-doped silicate glass (USG), or doped silicon oxide such as borophosphosilicate glass (BPSG), fused silica glass (FSG), phosphosilicate glass (PSG), boron doped silicon glass (BSG), and/or other suitable dielectric materials.

In some embodiments, the dielectric layer 120 includes a contact etch stop layer (CESL). In some embodiments, the dielectric layer 120 includes silicon nitride, silicon oxide, silicon oxynitride, and/or other materials known in the art.

In some embodiments, the dielectric layer 120 is formed using a printing, or a film formation process and a material removal process. In some embodiments, the dielectric layer 120 is formed by the printing, such as imprinting, screen printing, ink jet printing or any other suitable printing processes. In some embodiments, the dielectric layer 120 is formed by the film formation process and the material removal process. In some embodiments, the film formation process includes CVD, PVD, ALD or other suitable formation processes. In some embodiments, the material removal process includes photolithography and/or etching process, a laser drilling process or any other suitable material removal process. In some embodiments, the opening 120a has a bottom critical dimension BCD in a range of from 1 nm to 20 nm. In some embodiments, the opening 120a has a bottom critical dimension BCD in a range of from 5 nm to 15 nm. In some embodiments, the opening 120a has a bottom critical dimension BCD in a range of from 8 nm to 10 nm.

As shown in FIG. 3, a ruthenium-containing material 130 is filled in the opening 120a and in contact with the dielectric layer 120. In some embodiments, the ruthenium-containing material 130 only includes ruthenium. In some embodiments, the ruthenium-containing material 130 is formed using sputtering, ALD, PVD, CVD, e-beam evaporation, other methods known and used in the art for forming the ruthenium-containing material 130 or a combination thereof.

As shown in FIG. 4, the ruthenium-containing material 130 is polished using a slurry including an oxidizer. The oxidizer is configured to oxidize the ruthenium-containing material 130 to form by-products 135 in the opening 120a and laterally between the dielectric layer 120 and the ruthenium-containing material 130. That is, the by-products 135 can fill the interspace between the dielectric layer 120 and the ruthenium-containing material 130 formed during the CMP process, such that the slurry fails to penetrate through the interspace to be in contact with the conductive layer 110 underlying the dielectric layer 120 and the ruthenium-containing material 130. In some embodiments, the oxidizer is configured to oxidize ruthenium of the ruthenium-containing material 130 to form ruthenium oxide 135 in the opening 120a and laterally between the dielectric layer 120 and the ruthenium-containing material 130. In some embodiments, the ruthenium oxide material 135 includes ruthenium dioxide ($RuO_2$), ruthenium tetroxide ($RuO_4$), or a combination thereof. In some embodiments, the oxidizer is selected from the group consisting of hydrogen peroxide ($H_2O_2$), potassium periodate ($KIO_4$), potassium iodate ($KIO_3$), potassium permanganate ($KMnO_4$), iron(III) nitrate ($FeNO_3$), other suitable oxidizers and a combination thereof. In some embodiments, the oxidizer is in a range of from 0.1 wt % to 2 wt % based on the total weight of the slurry. In some embodiments, the oxidizer is in a range of from 0.1 wt % to 0.5 wt % based on the total weight of the slurry. In some embodiments, the oxidizer described above has a very low static etch rate (SER) and will not cause corrosion of the conductive layer 110.

In some embodiments, the slurry further includes an abrasive. In some embodiments, the abrasive is selected from the group consisting of silicon oxide (e.g., $SiO_2$), titanium oxide (e.g., $TiO_2$), aluminum oxide (e.g., $Al_2O_3$), zirconium oxide (e.g., $ZrO_2$), cerium oxide (e.g., $CeO_2$) and a combination thereof. In some embodiments, the abrasive is in a range of from 0.1 wt % to 1 wt % based on the total weight of the slurry. In some embodiments, the abrasive is in a range of from 0.2 wt % to 0.8 wt % based on the total weight of the slurry. In some embodiments, the abrasive has a diameter in a range of from 10 nm to 90 nm. In some embodiments, the diameter of the abrasive is in a range of from 25 nm to 50 nm. In some embodiments, the abrasive has two diameters respectively in a range of from 10 nm to 50 nm and a range of from 50 nm to 90 nm, and a difference between the two diameters is in a range of from 15 nm to 80 nm. In some embodiments, the difference between the two diameters of the abrasive is in a range of from 20 nm to 40 nm. The abrasive having two diameters (also called as "bi-model") can enhance removal of residues (e.g., ruthenium residues) during performing the CMP process. In some embodiments, the abrasive described above will not cause peeling between the dielectric layer 120 and the ruthenium-containing material 130.

In some embodiments, the slurry further includes a corrosion inhibitor. The corrosion inhibitor is configured to inhibit corrosion of the conductive layer 110. In some embodiments, the corrosion inhibitor is selected from the group consisting of benzotriazole (BTA), hexamine, phenylenediamine, dimethylethanolamine, 2-mercapto-benzothiazole (MBT), benzimidazole (BIA), tolyltrizole (TTA), 5-hexyl-1,2,3-benzotriazole (C6BTA), 3-amino-5-heptyl-1,2,4-triazole (AHT), 2-amino-thiazole (AZT), 2-amino-4,6-dimethyl-parimidine (ADMP), 3-phenyl-1,2,4-triazole (PTH), 3-phenyl-1,2,4-triazole-5-one, piperidine, phenyl-amino-triazine-dithiol (PTD), potassium ethylxanthate (KEX), benzylamine (BZA), ethanolamine, sodium tripolyphosphate, antioxidants and a combination thereof. In some embodiments, the corrosion inhibitor is in a range of from 0.001 wt % to 1 wt % based on the total weight of the slurry.

In some embodiments, the slurry further includes a polymer. The polymer is configured to reduce penetration of the slurry. In some embodiments, the polymer is selected from the group consisting of polyisocyante, polyamide, poly(methylmethacrylate), other suitable polymers and a combination thereof. In some embodiments, the polymer is in a range of from 0.01 wt % to 0.1 wt % based on the total weight of the slurry.

In some embodiments, the slurry further includes a surfactant. The surfactant is configured to change hydrophilic/hydrophobic property to prevent the slurry attacking the conductive layer 110. In some embodiments, the surfactant is selected from the group consisting of nonionic-anionic surfactants, Gemini surfactants, sodium dodecylsulfate, benzyl trim ethyl ammonium chloride and a combination thereof. In some embodiments, the surfactant is in a range of from 0.001 wt % to 0.5 wt % based on the total weight of the slurry.

In some embodiments, the method further includes performing an annealing process on the ruthenium-containing material 130 before polishing the ruthenium-containing material 130. In some embodiments, the annealing process is performed at a temperature in a range of from 100° C. to 600° C. In some embodiments, the annealing process is performed at a temperature in a range of from 150° C. to 500° C. In some embodiments, the annealing process is performed to increase grain size of the ruthenium-containing material.

In some embodiments, the method further includes performing a plasma cleaning process before filling the ruthenium-containing material 130 in the opening 120a and in contact with the dielectric layer 120. In some embodiments, a process gas of the plasma cleaning process comprises argon (Ar), hydrogen peroxide ($H_2O_2$), carbon dioxide ($CO_2$), other suitable gases or a combination thereof.

The present disclosure further provides a semiconductor structure. Embodiments of the semiconductor structure will be described below in detail.

In some embodiments, the semiconductor structure includes a conductive layer 110, a dielectric layer 120, a ruthenium material 130 and a ruthenium oxide material 135, as shown in FIG. 4. In some embodiments, the conductive layer 110 includes a metal selected from the group consisting of tungsten (W), cobalt (Co), ruthenium (Ru), other suitable metals and a combination thereof.

The dielectric layer 120 is over the conductive layer 110 and has an opening 120a exposing a portion of the conductive layer 110. In some embodiments, the dielectric layer 120 includes a dielectric material such as silicon oxide, silicon oxynitride, tetraethylorthosilicate (TEOS) oxide, un-doped silicate glass (USG), or doped silicon oxide such as borophosphosilicate glass (BPSG), fused silica glass (FSG), phosphosilicate glass (PSG), boron doped silicon glass (BSG), and/or other suitable dielectric materials. In some embodiments, the dielectric layer 120 includes a dielectric material such as silicon nitride, silicon oxide, silicon oxynitride, and/or other materials known in the art. In some embodiments, the opening 120a has a bottom critical dimension BCD in a range of from 1 nm to 20 nm. In some embodiments, the opening 120a has a bottom critical dimension BCD in a range of from 5 nm to 15 nm. In some embodiments, the opening 120a has a bottom critical dimension BCD in a range of from 8 nm to 10 nm.

The ruthenium material 130 is in the opening 120a and in contact with the portion of the conductive layer 110. In some embodiments, a portion of the ruthenium material 130 is in contact with the dielectric layer 120. In some embodiments, a bottom portion of the ruthenium material 130 is in contact with a sidewall of the opening 120a of the dielectric layer 120, as shown in FIG. 4. In some embodiments, the ruthenium material 130 has a top critical dimension TCD less than a bottom critical dimension BCD of the opening 120a, as shown in FIG. 4.

The ruthenium oxide material 135 is in the opening 120a and laterally between the ruthenium material 130 and the dielectric layer 120. In some embodiments, the ruthenium oxide material 135 includes ruthenium dioxide ($RuO_2$), ruthenium tetroxide ($RuO_4$), or a combination thereof. In some embodiments, the ruthenium oxide material is in a particle form. In some embodiments, the ruthenium oxide material is in a nanometric particle form. In some embodiments, the ruthenium oxide particle has a diameter in a range of from 0.01 nm to 5 nm. In some embodiments, the ruthenium oxide material 135 is in contact with the conductive layer 110. In some embodiments, the ruthenium oxide material 135 is in contact with the ruthenium material 130.

In some embodiments, the ruthenium oxide material 135 is in contact with the sidewall of the opening 120a of the dielectric layer 120.

In some embodiments, the semiconductor structure further includes other materials in the opening 120a and laterally between the ruthenium material 130 and the dielectric layer 120. The other materials are adjacent to or in contact with the ruthenium oxide material 135. In some embodiments, other materials may be a polymer selected from the group consisting of polyisocyante, polyamide, poly(methylmethacrylate) and a combination thereof. In some embodiments, other materials may be a corrosion inhibitor selected from the group consisting of benzotriazole (BTA), hexamine, phenylenediamine, dimethylethanolamine, 2-mercapto-benzothiazole (MBT), benzimidazole (BIA), tolyltrizole (TTA), 5-hexyl-1,2,3-benzotriazole (C6BTA), 3-amino-5-heptyl-1,2,4-triazole (AHT), 2-aminothiazole (AZT), 2-amino-4,6-dimethyl-parimidine (ADMP), 3-phenyl-1,2,4-triazole (PTH), 3-phenyl-1,2,4-triazole-5-one, piperidine, phenyl-amino-triazine-dithiol (PTD), potassium ethylxanthate (KEX), benzylamine (BZA), ethanolamine, sodium tripolyphosphate, antioxidants and a combination thereof. In some embodiments, other materials may be a surfactant selected from the group consisting of nonionic-anionic surfactants, Gemini surfactants, sodium dodecylsulfate, benzyl trim ethyl ammonium chloride and a combination thereof. In some embodiments, other materials may be an abrasive selected from the group consisting of silicon oxide, titanium oxide, aluminum oxide, zirconium oxide, cerium oxide and a combination thereof.

According to some embodiments, a method of manufacturing a semiconductor structure includes: forming a dielectric layer over a conductive layer; removing a portion of the dielectric layer to form an opening exposing a portion of the conductive layer; filling a ruthenium-containing material in the opening and in contact with the dielectric layer; and polishing the ruthenium-containing material using a slurry including an abrasive and an oxidizer selected from the group consisting of hydrogen peroxide ($H_2O_2$), potassium periodate ($KIO_4$), potassium iodate ($KIO_3$), potassium permanganate ($KMnO_4$), iron(III) nitrate ($FeNO_3$) and a combination thereof.

According to some embodiments, a method of manufacturing a semiconductor structure includes: forming a dielectric layer over a conductive layer, in which the dielectric layer has an opening exposing a portion of the conductive layer; filling a ruthenium-containing material in the opening and in contact with the dielectric layer; and polishing the ruthenium-containing material using a slurry including an oxidizer to oxidize ruthenium of the ruthenium-containing material to form ruthenium oxide in the opening and laterally between the dielectric layer and the ruthenium-containing material.

According to some embodiments, a semiconductor structure includes: a conductive layer; a dielectric layer over the conductive layer, in which the dielectric layer includes an opening exposing a portion of the conductive layer; a ruthenium material in the opening and in contact with the portion of the conductive layer; and a ruthenium oxide material in the opening and laterally between the ruthenium material and the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
    forming a dielectric layer over a conductive layer;
    removing a portion of the dielectric layer to form an opening exposing a portion of the conductive layer;
    filling a ruthenium-containing material in the opening and in contact with the dielectric layer; and
    polishing the ruthenium-containing material using a slurry comprising an abrasive and an oxidizer selected from the group consisting of hydrogen peroxide ($H2O2$), potassium periodate ($KIO4$), potassium iodate ($KIO3$), potassium permanganate ($KMnO4$), iron(III) nitrate ($FeNO3$) and a combination thereof, wherein the abrasive has two diameters respectively in a range of from 10 nm to 50 nm and a range of from 50 nm to 90 nm, and a difference between the two diameters is in a range of from 15 nm to 80 nm.

2. The method of claim 1, wherein the abrasive is selected from the group consisting of silicon oxide, titanium oxide, aluminum oxide, zirconium oxide, cerium oxide and a combination thereof.

3. The method of claim 1, wherein the abrasive is in a range of from 0.1 wt % to 1 wt % based on the total weight of the slurry.

4. The method of claim 1, wherein the oxidizer is in a range of from 0.1 wt % to 2 wt % based on the total weight of the slurry.

5. The method of claim 1, wherein the slurry further comprises a corrosion inhibitor selected from the group consisting of benzotriazole (BTA), hexamine, phenylenediamine, dimethylethanolamine, 2-mercapto-benzothiazole (MBT), benzimidazole (BIA), tolyltrizole (TTA), 5-hexyl-1,2,3-benzotriazole (C6BTA), 3-amino-5-heptyl-1,2,4-triazole (AHT), 2-amino-thiazole (AZT), 2-amino-4,6-dimethylparimidine (ADMP), 3-phenyl-1,2,4-triazole (PTH), 3-phenyl-1,2,4-triazole-5-one, piperidine, phenyl-amino-triazine-dithiol (PTD), potassium ethylxanthate (KEX), benzylamine (BZA), ethanolamine, sodium tripolyphosphate, and a combination thereof.

6. The method of claim 1, wherein the slurry further comprises a polymer selected from the group consisting of polyisocyante, polyamide, poly(methylmethacrylate) and a combination thereof.

7. The method of claim 1, wherein the slurry further comprises a surfactant selected from the group consisting of nonionic-anionic surfactants, Gemini surfactants, sodium dodecylsulfate (SDS), benzyl trim ethyl ammonium chloride (BTEAC) and a combination thereof.

8. The method of claim 1, further comprising performing an annealing process on the ruthenium-containing material before polishing the ruthenium-containing material.

9. The method of claim 8, wherein the annealing process is performed at a temperature in a range of from 100° C. to 600° C.

10. The method of claim 1, further comprising performing a plasma cleaning process before filling the ruthenium-containing material in the opening and in contact with the dielectric layer.

11. The method of claim 10, wherein a process gas of the plasma cleaning process comprises argon (Ar), hydrogen peroxide ($H2O2$), carbon dioxide ($CO2$) or a combination thereof.

12. The method of claim 1, wherein polishing the ruthenium-containing material produces by-products in the opening and laterally between the ruthenium-containing material and the dielectric layer.

13. The method of claim 12, wherein the by-products include ruthenium oxide.

14. A method of manufacturing a semiconductor structure, comprising:
    forming a dielectric layer over a conductive layer, wherein the dielectric layer has an opening exposing a portion of the conductive layer;
    filling a ruthenium-containing material in the opening and in contact with the dielectric layer; and
    polishing the ruthenium-containing material using a slurry comprising an oxidizer to oxidize ruthenium of the ruthenium-containing material to form ruthenium oxide in the opening and laterally between the dielectric layer and the ruthenium-containing material.

15. A method, comprising:
    forming a dielectric layer over a conductive layer;
    etching the dielectric layer to form an opening extending through the dielectric layer;
    overfilling the opening in the dielectric layer with a ruthenium material; and
    performing a chemical mechanical polishing (CMP) process on the ruthenium material at least until the dielectric layer is exposed, wherein the CMP process produces by-products in an interspace between the ruthenium material and a sidewall of the opening to block a slurry used in the CMP process from penetrating through the interspace between the ruthenium material and the sidewall of the opening.

16. The method of claim 15, wherein the by-products are ruthenium oxide.

17. The method of claim 15, wherein the by-products are produced from oxidizing the ruthenium material by an oxidizer in the slurry used in the CMP process.

18. The method of claim 15, wherein the by-products are larger in an upper region of the opening than in a lower region of the opening.

19. The method of claim 15, further comprising:
    performing an annealing process on the ruthenium material before performing the CMP process, wherein a temperature of the annealing process is selected such that a grain size of the ruthenium material is increased by the annealing process.

20. The method of claim 15, further comprising:
    performing a plasma cleaning process to clean the opening in the dielectric layer before overfilling the opening with the ruthenium material.

* * * * *